United States Patent [19]
Tokuda

[11] Patent Number: 5,084,742
[45] Date of Patent: Jan. 28, 1992

[54] LIGHT EMITTING DIODE AND ITS ARRAY AND METHOD OF MAKING THE SAME

[75] Inventor: Jun Tokuda, Kawasaki, Japan

[73] Assignee: Eastman Kodak Company, Rochester, N.Y.

[21] Appl. No.: 662,683

[22] Filed: Mar. 1, 1991

[30] Foreign Application Priority Data

Mar. 6, 1990 [JP] Japan .................................. 2-54816

[51] Int. Cl.$^5$ ...................... H01L 33/00; H01L 21/24
[52] U.S. Cl. ........................................ 357/17; 357/16; 357/45; 357/47; 357/55; 437/19; 437/107; 437/127; 437/133; 437/134; 437/248; 437/906
[58] Field of Search .................. 357/17, 45, 47, 16, 357/55; 437/19, 107, 127, 133, 134, 248, 906

[56] References Cited

U.S. PATENT DOCUMENTS 5,007,063 4/1991 Kahen .................................. 357/17

Primary Examiner—Edward J. Wojciechowicz
Attorney, Agent, or Firm—Raymond L. Owens

[57] ABSTRACT

A light emitting diode and its array having improved light emitting efficiency are disclosed. A first layer of a semiconductor material of a first conductivity type and a second layer of a semiconductor material of a second conductivity type are formed on one surface of a substrate of a semiconductor material of the first conductivity type. A first electrode is formed on the second layer and a second electrode is formed on a surface of the substrate opposite the one surface. From the side of the first electrode a light which is not absorbed in the first and second semiconductor layers, but is absorbed by the first electrode, is directed through the first and second layers and the substrate to selectively alloy the interface between the substrate and the other electrode. This forms a non-alloyed region between the second electrode and the substrate directly opposite the first electrode and alloyed regions along each side of the non-alloyed region.

33 Claims, 3 Drawing Sheets

LIGHT EMITTING DIODE AND ITS ARRAY AND METHOD OF MAKING THE SAME

FIELD OF THE INVENTION

The present invention relates to a light emitting diode, its array and method of making the same, and, more particularly, to an array of light emitting diodes which is formed from closely positioned diodes on a substrate and which provides a suitable light source for an optical printer.

BACKGROUND OF THE INVENTION

An array of light emitting diodes, which is formed by a plurality of p-n junction light emitting diodes or p-i-n junction light emitting diodes closely positioned on a substrate, is advantageous in that it enables image information to be processed relatively easily by electrically controlling each of the diodes, and also has several applications.

In response to the recent increase in not only the quantity of information, but also the quality of information to be handled, which now includes in addition to written information, image information such as drawings, photographs, and so on, a printer has become necessary which has a higher dot density and faster printing speed.

As a response to these requirements, a light emitting diode printer was developed which uses an array of light emitting diodes as a light source. The printer has an optical write head including an array of solid state high density light emitting diodes positioned along a photosensitive drum. Light from the head is focused on a photosensitive drum through an array of converging rod lenses. By this arrangement, an electrostatic latent image is formed such that the light emitting diodes are selectively switched on and off in accordance with an image signal.

The optical write head comprises a plurality of array chips, such as thirty five chips, each of which normally has 64 to 256 light emitting diodes integrated with a predetermined density, e.g., 16 elements/mm.

Thus, in printers using light emitting diodes, as each of the light emitting diodes is electrically controlled, no mechanical driving device is needed. That is, no space for light deflection is required and it has no moving part, but it may use a simple equimagnification array lens in an optical system. Therefore, the light emitting diode printers are also known as non-impact optical printers, and can theoretically be constructed to be very small and highly reliable compared with laser printers which require mechanical arrangements such as rotatable polygon mirrors for light beam scanning and a corresponding intricate optical system.

FIG. 1 shows a sectional view of an example of a prior art light emitting diode array 200 applicable to a light emitting diode printer, and its arrangement and a manufacturing process will be explained with reference to this figure. The array 200 comprises a substrate 210 of n-type conductivity gallium arsenide (GaAs) having a pair of opposed surfaces 209 and 211. On the surface 211 of the substrate 200 is a layer 212 of n-type conductivity gallium arsenide phosphide (GaAsP). Within the GaAsP layer 212 are spaced apart regions 216 which are doped with zinc so as to be of p-type conductivity. On the surface of the GaAsP layer 212 is a layer 214 of an insulating material, such as silicon nitride (SiN), having openings 215 therethrough over the p-type regions 216. A p-electrode 218 is on each of the p-type regions 216 and an n-electrode 220 is on the surface 209 of the substrate 210. The n-electrode 220 is alloyed with the substrate 210 to form an alloyed region 224 along its interface with the substrate 210. A protection layer 222 of an insulating material, such as silicon oxide ($SiO_x$) covers the silicon nitride layer 214, the p-electrodes 218 and any exposed portions of the p-type regions 216. In order to simplify the description, only two light emitting diodes 226 are shown in FIG. 1, each of which is formed by a p-type region 216 and the n-type GaAsP layer 212.

A process for manufacturing the array 200 of light emitting diodes 226 shown in FIG. 1 will now be explained. On the n-type GaAs substrate 210, the n-type GaAsP layer 212 is deposited by means of a VPE (Vapor Phase Epitaxy) method. Then, on the upper surface of the n-type GaAsP layer 212, spared apart p-type regions 216 are formed by means of zinc (Zn) diffusion using the SiN film 214 as a mask. Interfaces thus formed between the n-type GaAsP layer 212 and the p-type regions 216 are p-n junctions 228 to provide light emitting regions.

Partly on the upper surface of each of the p-type regions 216 and on the lower surface 209 of the n-type GaAs substrate 210, metal layers are respectively deposited to form predetermined patterns by means of vapor deposition etc., and then the whole wafer is heated to form alloys from the metals. In this way, the p-electrodes 218 and the n-electrode 220 are formed. Furthermore, the silicon oxide film 222 is also applied on the upper surface as a non-reflective coating. The portion of the silicon oxide film 222 which is located remote from the light emitting diodes is removed to form bonding pads (not shown) of the p-electrodes 218.

In each of the light emitting diodes 226 in such an array 200 as mentioned above, actual light emission depends on an amount of electric current flowing through the p-n junction region 228. Also, since a current distribution in the n-type GaAs substrate 210 depends on an electrical field induced therein, and an electrical field is strongest at the regions located immediately below the p-electrodes 218, the amount of current flowing through these regions is highest.

However, even if each diode emits a light at the region located immediately below each of the p-electrodes 218, the upper portion of such a light emitting region is covered with the p-electrode 218, which results in not only a low efficiency in taking light from that region to the outside, but also a wasteful dissipation of heat generated by the current injected from each of the p-electrodes 218.

SUMMARY OF THE INVENTION

An object of the present invention is to provide a light emitting diode and an array thereof, and a method of manufacturing the same wherein a density of current which flows through a p-n junction region not located immediately below an electrode of the light emitting diode is higher than that of a current which flows through a p-n junction region located immediately below the electrode whereby the diode may have higher light emitting efficiency and thereby stably operate.

In order to accomplish above mentioned object, the light emitting diode according to the present invention, comprises a substrate of a semiconductor material of a first conductivity type having opposed surfaces. A first layer of a semiconductor material of the first conductivity type is on one surface of the substrate. A second layer of a semiconductor material of a second conductor type different from the first conductivity type is on the first semiconductor layer for forming a light emitting region. A first electrode is on the side of the substrate opposite the one surface, and a second electrode is on the second semiconductor layer. At the interface between the substrate and the first electrode is a high resistance region which is positioned directly opposite the second electrode and a lower resistance region adjacent to the high resistance region. An array of the light emitting diodes can be formed on the substrate.

Such a light emitting diode may be manufactured by the steps of depositing a first layer of a semiconductor material of a first conductivity type on one surface of a substrate of a semiconductor material of the one conductivity type. A second layer of a semiconductor material of a second conductivity type different from said first conductivity type is formed along the first layer for forming a light emitting region. A first electrode is deposited on the surface of said substrate opposite said one side, and a second electrode is deposited o said second semiconductor layer, respectively. Portions of the substrate and the first electrode are heated to form at the junction therebetween a high resistance non-alloyed region directly opposite the second electrode and lower resistance alloyed regions at each side of the non-alloyed region. An array of the light emitting diodes can be formed by forming a plurality of second layers along the first layer and a second electrode on each of the second layers.

The invention will be better understood from the following more detailed description taken with the accompanying drawings.

It should be understood that the drawings are not necessarily drawn to scale.

DETAILED DESCRIPTION

Some preferred embodiments of the invention will now be described with reference to FIGS. 2 and 3.

Figure 1:
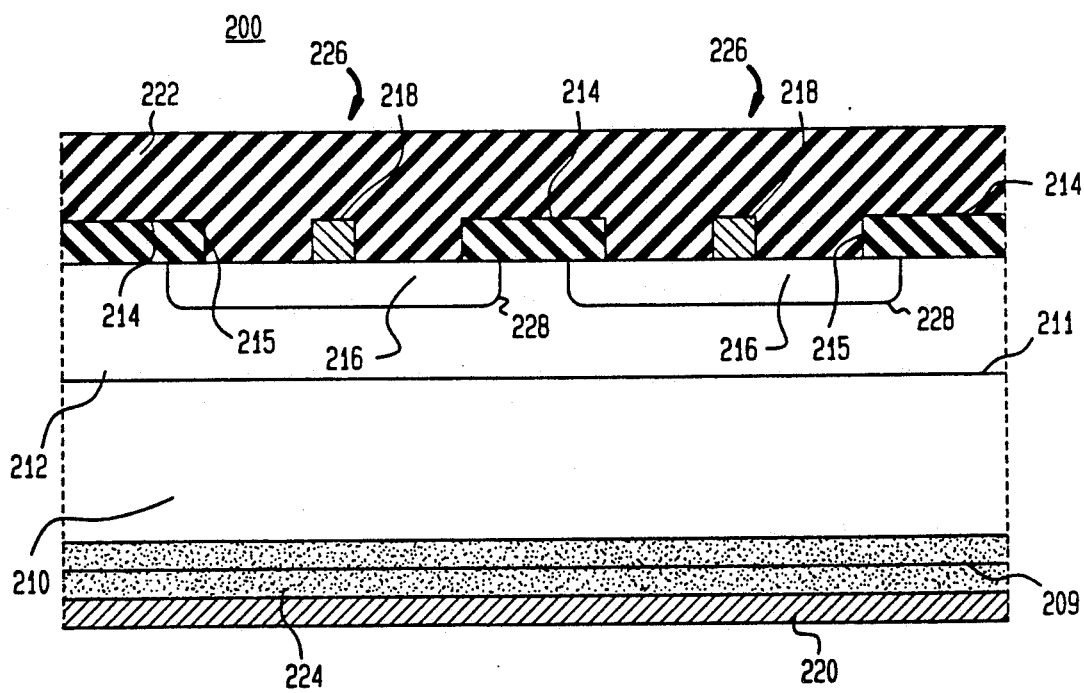
FIG. 1 is a sectional view of a portion of a prior array of light emitting diodes.
Figure 2:
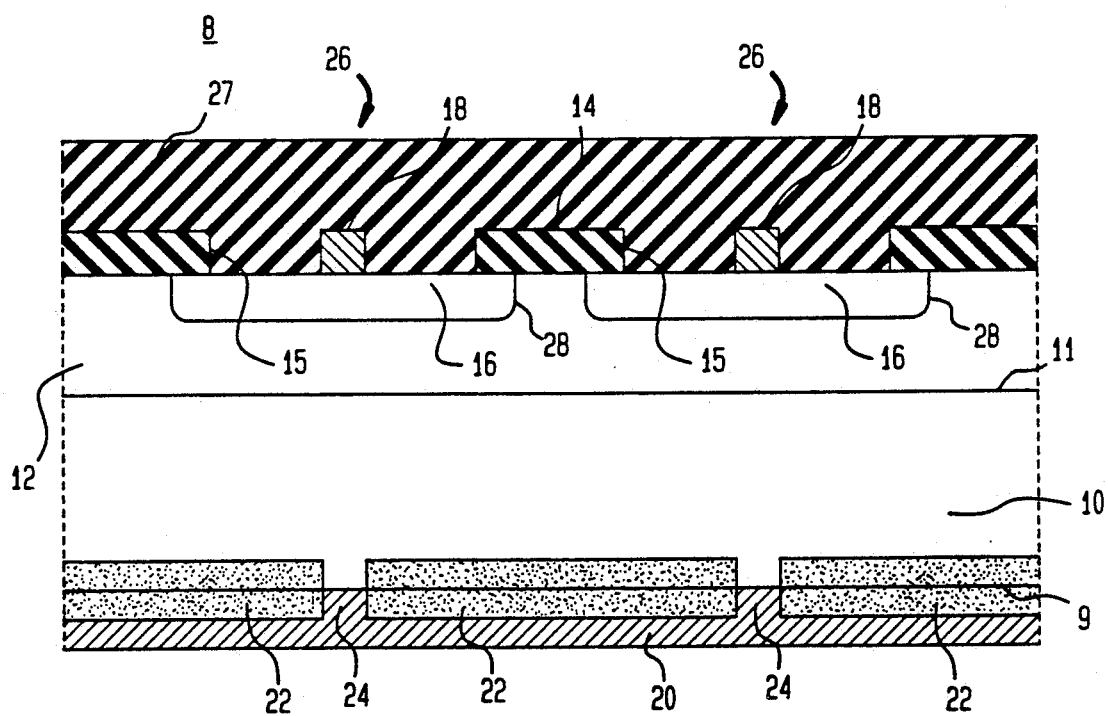
FIG. 2 is a sectional view of a portion of an embodiment of an array of light emitting diodes in accordance with the present invention.

Referring now to FIG. 2, there is shown a sectional view of a portion of an array 8 of light emitting diodes 26 in accordance with the present invention. This diode array 8 is realized as an array of GaAsP light emitting diodes arranged in a predetermined pattern and comprises a substrate 10 of n-type conductivity gallium arsenide (GaAs) having opposed surfaces 9 and 11. A layer 12 of n-type gallium arsenide phosphide (GaAsP) is on the surface 11 of the substrate 10. A plurality of spaced apart regions 16, which are diffused with zinc (Zn) so as to be of p-type conductivity, are in the GaAsP layer 12. On the GaAsP layer 12 is a layer 14 of silicon nitride (SiN) having openings 15 therethrough over the p-type regions 16. A separate p-electrode 18 is on each of the p-type regions 16 and a n-electrode 24 is on the surface 9 of the substrate 10. In the array 8, alloyed regions 22 are provided at portions of the interface between the substrate 10 and the n-electrode 20, but with the regions 24 of the interface located immediately below the p-electrodes 18 not being alloyed. The upper surface of the array is covered with a film 27 of an insulating material, such as silicon oxide. In order to simplify the description, only two light emitting diodes 26 are shown in the figure.

Next, a method of manufacturing the diode array 8 will be described in detail. On the upper surface 11 of the n-type GaAs substrate 10, which is doped with silicon (Si) of an density of $2 \times 10^{18}$ impurities/cm$^3$, the n-type GaAsP layer 12 is deposited to a thickness of approximately 50 micrometers by means of the vapor phase epitaxy (VPE) method in order to improve the quality of the crystal of the substrate. A layer 14 of silicon nitride (SiN) is then deposited on the GaAsP layer 12 by chemical vapor deposition, and the openings 15 are formed in the SiN layer 12 by the well known photolithographic technique and etching. Zinc (Zn) is then diffused into the GaAsP layer 12 through the openings 15 in the SiN layer 14, which serves as a mask, to form the p-type regions 16 in an island shape with a thickness of about 1.5 micrometers. This forms a light emitting region at the p-n junction 28 between each of the p-type regions 16 and the n-type GaAsP layer 12.

On the upper side of the p-type regions 16 thus formed, a layer of aluminum is deposited by means of vacuum evaporation or sputtering and is defined by photolithography to form the p-electrodes 18. Then alloying is performed by heating the whole wafer. On the lower side 9 of the n-type GaAs substrate 10 a multi-layered metal layer comprising first a layer of a gold germanium alloy (AuGe), then a layer of nickle (Ni) and finally a layer of gold (Au) is vapor-deposited for forming the n-electrode 20.

Then, a laser beam is radiated from the upper side of the substrate, i.e., from the upper side of the p-electrodes 18 by a Q switch Nd:YAG laser with an energy density of 1.4 J/cm$^2$ and having a wavelength not absorbed by the p-type regions 16, the SiN film 14, the n-type GaAsP layer 12 and the n-type GaAs substrate 10. In this way, the p-electrodes 18 act as a mask so that the laser beam is not allowed to reach the regions located immediately below the p-electrodes 18, but is only allowed to transmit to the regions adjacent to the regions immediately below the p-electrodes 18. Therefore, the laser beam is absorbed only at the portions 22 of the n-electrode 20 which are not masked by the p-electrodes 18, causing these portions to be heated so that the heated portions of the n-electrode and the adjacent portions of the n-type GaAs substrate 10 are alloyed together. On the other hand, the regions 24 located immediately below the p-electrodes 18 are not heated sufficiently and remain unalloyed. In other words, the interface between the n-type GaAs substrate 10 and the n-electrode 20 is selectively alloyed to form the alloyed regions 22 and the non-alloyed regions 24.

Then, the silicon oxide film 27 is formed on the upper side the wafer as a non-reflective coating, and bonding pads are formed at a predetermined distance from the light emitting elements.

In this way, the light emitting diode array 8 according to the present invention has, at the interface between the n-electrode 20 and the GaAs substrate 10, the non-alloyed regions 24 immediately below the p-electrodes 18 and the alloyed regions 22 adjacent to the regions 24 immediately below the p-electrodes 18. The alloyed regions 22 have a lower resistance than the non-alloyed regions 24. As a result, of the currents flowing through the p-type regions 16, the current flowing through the alloyed regions 22 becomes higher than that of the non-alloyed regions 24. Thus, a light emitting efficiency for an injected current can be substantially improved.

As described above, the light emitting regions, as mentioned above, have been formed at the p-n junction interface 28 between the p-type regions 16 and the n-type GaAsP layer 12. It is noted, however, that it is not always necessary to provide a substrate and an n-type semiconductor layer separately, but, depending upon a kind of an n-type semiconductor substrate, the p-type regions can be formed directly in the substrate.

Figure 3:
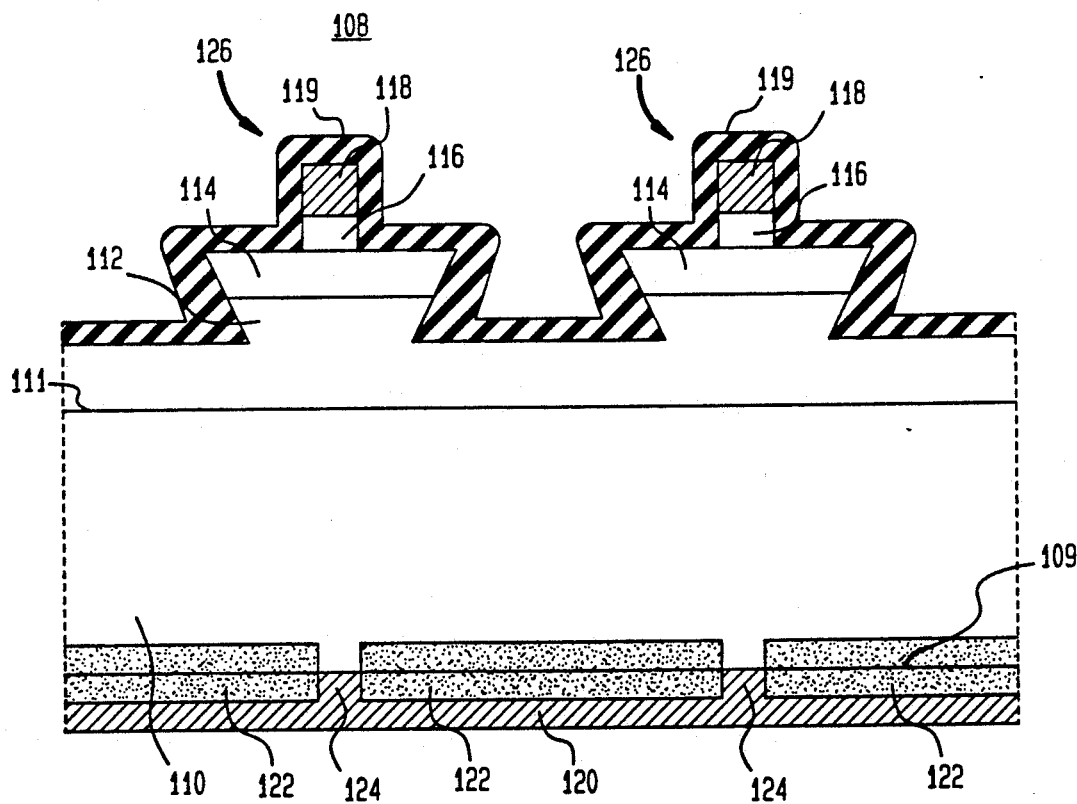
FIG. 3 is a sectional view of a portion of another embodiment of an array of light emitting diodes in accordance with the present invention.

Referring now to FIG. 3, there is shown is a sectional view of a portion of another embodiment of an array 108 of light emitting diodes 126 in accordance with the present invention with the light emitting diodes 126 being arranged in a predetermined pattern. The array 108 of light emitting diodes comprises a substrate 110 of p-type conductivity gallium arsenide (GaAs) having opposed surfaces 109 and 111. On the surface 111 of the substrate 110 is a layer 112 of p-type conductivity aluminum gallium arsenide (AlGaAs). On portions of the p-type AlGaAs layer 112 are spaced apart layers 114 of n-type conductivity aluminum gallium arsenide (AlGaAs). On each of the n-type AlGaAs layers 114 is a layer 116 of n+ type conductivity gallium arsenide (GaAs). An n-electrode 118 is on each of the n+ GaAs layers 116 and a p-electrode 120 is on the surface 109 of the substrate 110. A protection film 119, such as of a silicon oxide, covers the exposed surfaces of the p-type AlGaAs layer 112, the n-type AlGaAs layer 114 and the n-electrode 118. The portions 124 of the interface between the p-electrode 120 and the substrate 110 directly opposed to the n-electrodes 118 are not alloyed whereas the portions 122 of this interface on either side of the non-alloyed junctions are alloyed. Each of the n+ type GaAs layers 116, n-type AlGaAs layer 114 and a portion of the p-type AlGaAs layer 112 forms a mesa which defines one of the light emitting diodes 126. In order to simplify the description, only two light emitting diodes 126 are shown in FIG. 3.

Next, a method of manufacturing the diode array 108 will be described. First, on the surface 111 of the p-type GaAs substrate 110, the p-type AlGaAs layer 112 is deposited by means of an LPE (Liquid Phase Epitaxy) method. Then, on the p-type AlGaAs layer 112 the n-type AlGaAs layer 114 and the n+ type GaAs layer 116 are successively d(e)posited by means of an LPE method. Then, pattern forming is effected by means of photolithography in order to etch the n-type AlGaAs layer 114, the n+ type GaAs layer 116 and the p-type AlGaAs layer 112 so as to form the mesas which define the light emitting regions 126. On each of the residual portions of the n+ type GaAs layer 116 thus etched, an aluminum (Al) layer is deposited and defined in a desired shape by means of photolithography to form one of the n-electrodes 118. Then the wafer is heated to 450° C. for five minutes to alloy the layers. On the upper side of the wafer, the silicon oxide film 120 is formed by means of a plasma CVD (Chemical Vapor Deposition) method for both non-reflective coating and protection. After that, the p-electrode 122 is deposited on the lower surface 109 of the p-type GaAs substrate 110 and, from the side of the n-electrodes 118, the wafer is illuminated by a laser beam radiated from a Q switch Nd:glass laser which cannot transmit the regions corresponding to the n-electrodes 118 with an energy density of 1.4 J/cm$^2$. This causes the regions not masked by the n-electrodes 118 to be self-aligned and selectively alloyed. Thus, in the same way as the first embodiment, alloyed regions 122 and non-alloyed regions 124 are formed at the interface between the p-type GaAs substrate 110 and the p-electrode 120.

A light emitting intensity of the light emitting diode array shown in FIG. 3 depends on the density of the currents flowing through the p-n junction interfaces between the p-type AlGaAs layer 112 and each of the n-type AlGaAs layers 114. However, the currents flowing through the regions which are not masked by the n-electrodes 118 have a higher external output efficiency of light than the currents flowing through the regions masked by the n-electrodes 118, resulting in an improved efficiency of light emission for an injection current.

In this embodiment, the n-type AlGaAs layer 114 as an n-type semiconductor layer has too high a resistance value to be directly connected to each n-electrode 118. Thus the n+ type GaAs layer 116 is provided in order to reduce the resistance value. However, the n+ type GaAs layer 116 may be eliminated if an n-type semiconductor layer having a low resistance value is employed.

It may be possible to selectively alloy the junction plane between the p-type GaAs substrate 110 and the p-electrode 120 even in the case where the light emitting diode elements 126 are separated from each other by ion injection instead of forming the n-type AlGaAs layers 114 by etching into a desired pattern. In this method, after the n-type AlGaAs layer 114 and the n+ type GaAs layer 116 are formed, an aluminum layer is then vapor-deposited and defined on the n+ type GaAs layer 116 to form the n-electrodes 118 by means of photolithography. The wafer is then heated to 450° C. for five minutes in order to alloy the layers. After that, the p-electrode 120 is deposited on the lower surface 109 of the p-type GaAs substrate 110. The wafer is then illuminated from the side of the n-electrodes 118 by a laser beam radiated from a Q switch Nd:glass laser which cannot transmit through the regions corresponding to the n-electrodes 118 at an energy density of 1.4 J/cm$^2$, causing the portion not masked by the n-electrodes 11 to be selfcoordinately and selectively alloyed. In the same way as the second embodiment, the alloyed regions 122 and the nonalloyed regions 124 are formed at the interface between the surface 109 of the p-type GaAs substrate 110 and the p-electrode 120.

After those regions 122 and 124 have been formed, the regions except for the light emitting regions of the n-type AlGaAs layer 114 are subjected to ion implantation from the side of the n-electrodes 118 in order to make the regions amorphous so that the light emitting regions are separated from each other. On the upper side of the wafer the silicon oxide layer 119 is formed for both non-reflecting coating and protection by means of a plasma CVD method. Thus, an array of light emitting diodes can be formed which have the same function as that of the second embodiment.

Although the present invention has been described in detail with reference to certain embodiments of an array of light emitting diodes, it will be understood that various changes and modifications are possible without departing from the spirit and scope of the invention. For example, the composition and thickness of layers of the light emitting diodes are not limited to GaAs, Al- GaAs etc. as described above. Other semiconductor materials such as AlGaInP, GaInAs, GaAlInP, AlGaAsSb etc. having a desired composition and thickness may also be used.

In the embodiments, VPE or LPE methods has been used for depositing a semiconductor layer on a substrate. However, in addition to these method, such methods as MBE (Molecular Beam Epitaxy), MOCVD (Metal Organic Chemical Vapor Deposition), CBE (Chemical Beam Epitaxy) may also be used.

In the embodiments, Q switch Nd:YAG laser and Q switch Nd:glass laser are used for selectively alloying the interface between the electrode and the substrate. It may, however, be possible, to use a laser having a lower photon energy than a band gap energy such as a $CO_2$ laser in accordance with a substrate used for a light emitting diode array.

While the invention has been described in relation to light emitting diode arrays, it should be clear that these arrangements and processes are also applicable to a single light emitting diode.

What is claimed is:

1. A light emitting diode comprising:
   a substrate of a semiconductor material of one conductivity type have a pair of opposed surfaces;
   a first layer of a semiconductor material of the first conductivity type on one surface of said substrate;
   a second layer of a semiconductor material of a second conductivity type along said first semiconductor layer for forming a light emitting region, the second conductivity type being different from the first conductivity type;
   a first electrode formed on the other side of said substrate;
   a second electrode formed on said second semiconductor layer;
   a high resistance region at the interface between said substrate and said first electrode positioned directly opposite said second electrode; and
   a lower resistance region at the interface between said substrate and said first electrode adjacent to said high resistance region.

2. The light emitting diode of claim 1 wherein there is a lower resistance region at the interface between the substrate and the first electrode adjacent to and on each side of the high resistance region.

3. The light emitting diode of claim 2 in which the lower resistance regions between the substrate and the first electrode are alloyed regions and the high resistance region is a non-alloyed region.

4. The light emitting diode of claim 3 in which the second layer is a region of the second conductivity type within said first layer.

5. The light emitting diode of claim 4 in which the substrate is of gallium arsenide and the first layer and second layer are each of aluminum gallium arsenide.

6. The light emitting diode of claim 5 in which the first conductivity type is n-type and the second conductivity type is p-type.

7. The light emitting diode of claim 6 in which the second layer is formed of p-type conductivity modifiers in a portion of the first layer.

8. The light emitting diode of claim 3 in which said second layer is on the first layer.

9. The light emitting diode of claim 8 further comprising a third layer of a semiconductor material on said second layer, said third layer being of the second conductivity type but of higher conductivity than the second layer and the second electrode is on the third layer.

10. The light emitting diode of claim 9 in which the substrate and the third layer are of gallium arsenide and the first layer and second layer are of aluminum gallium arsenide.

11. The light emitting diode of claim 10 in which the first conductivity type is p-type and the second conductivity type is n-type.

12. An array of light emitting diodes comprising:
    a substrate of a semiconductor material of one conductivity type having a pair of opposed surfaces;
    a first layer of a semiconductor material of the first conductivity type on one of said surfaces of said substrate;
    a plurality of second layers of a semiconductor material of a second conductivity type different from said first conductivity type spaced along said first layer;
    a first electrode on the other surface of said substrate;
    a second electrode on each of said second layers;
    a separate high resistance region at the interface between said substrate and said first electrode positioned directly opposite each of said second electrodes, and
    a lower resistance region at the interface between said substrate and said first electrode on each side of each of said high resistance regions.

13. The array of claim 12 wherein each of the low resistance regions between the substrate and the first electrode is a alloyed region therebetween and each of the high resistance regions is a non-alloyed region.

14. The array of claim 13 in which each of the second layers is a region of the second conductivity type within the first layer.

15. The array of claim 14 in which the substrate is of gallium arsenide and the first and second layers are of aluminum gallium arsenide.

16. The array of claim 15 in which the first conductivity type is n-type and the second conductivity type is p-type.

17. The array of claim 16 in which each of the second layer is formed of p-type conductivity modifiers in the first layer.

18. The array of claim 13 in which each of the second layers is a layer on the first layer.

19. The array of claim 18 further comprising a separate third layer of a semiconductor material on each of said second layers, each of said third layers being of the second conductivity type but of higher conductivity than the second layer and each of the second electrodes is on a third layer.

20. The array of claim 19 in which the substrate and the third layers are of gallium arsenide and the first and second layers are of aluminum gallium arsenide.

21. The array of claim 20 in which the first conductivity type is p-type and the second conductivity type is n-type.

22. A method of manufacturing a light emitting diode, comprising the steps of:
    depositing a first layer of a semiconductor material of a first conductivity type on one surface of a substrate of a semiconductor material of said one conductivity type;
    forming along said first semiconductor layer a second layer of a semiconductor material of a second conductivity type different from said first conductivity type for forming a light emitting region;

depositing a first electrode on a surface of said substrate opposite said one surface and a second electrode on said second semiconductor layer, respectively; and heating portions of said substrate and the first electrode so as to form at the junction therebetween a high resistance non-alloyed region directly opposite the second electrode and lower resistance alloyed regions at each side of the non-alloyed region.

23. The method of claim 22 in which the substrate and first electrode are heated by illuminating them from the side of the second electrode with a light beam which is not absorbed in the first and second semiconductor layers but is absorbed by the second electrode.

24. The method of claim 23 in which the substrate and first electrode are illuminated with a laser beam.

25. The method of claim 24 wherein the second layer is formed by embedding conductivity modifiers of the second conductivity type into a portion of the first layer.

26. The method of claim 24 in which the second layer is formed by depositing a semiconductor material of the second conductivity type on the first layer.

27. The method of claim 26 further comprising the step of depositing a third layer of a semiconductor material of the second conductivity type on said second layer, and pattern etching the third layer, said second layer and a portion of the first layer to form a mesa which defines a light emitting region at the interface between the first and second layers.

28. A method of manufacturing an array of light emitting diodes, comprising the steps of:

depositing a first layer of a semiconductor material of a first conductivity type on one surface of a substrate of a semiconductor material of said one conductivity type;

forming along said first semiconductor layer a plurality of spaced second layers of a semiconductor material of a second conductivity type different from said first conductivity type;

depositing a first electrode on a surface of said substrate opposite said one surface;

depositing a second electrode on each of said plurality of second semiconductor layers; and heating portions of the substrate and the first electrode so as to form at the junction therebetween high resistance non-alloyed regions directly opposite each of the second electrodes and lower resistance alloyed regions at each side of the non-alloyed regions.

29. The method of claim 28 in which the substrate and first electrode are heated by illuminating them from the side of the second electrode with a light beam which is not absorbed in the first and second layers but is absorbed by the second electrode.

30. The method of claim 29 in which the substrate and first electrode are illuminated by a laser beam.

31. The method of claim 30 wherein the second layers are each formed by embedding a conductivity modifier of the second conductivity type into a separate portion of the first layer.

32. The method of claim 30 in which each of the second layers is formed by depositing a layer of a semiconductor material of the second conductivity type on the first layer and removing portions of the deposited layer to form separate second layers.

33. The method of claim 32 further comprising depositing a third layer of a semiconductor material of the second conductivity type on each of said second layers, and pattern etching the third layer, second layer and a portion of the first layers to form a plurality of spaced mesas which define the light emitting regions at the interface of the first and second layers.

* * * * *